United States Patent [19]

Guarino

[11] Patent Number: 4,699,555
[45] Date of Patent: Oct. 13, 1987

[54] MODULE POSITIONING APPARATUS

[75] Inventor: Nicholas Guarino, Arlington, Mass.

[73] Assignee: Micrion Limited Partnership, Beverly, Mass.

[21] Appl. No.: 861,145

[22] Filed: May 8, 1986

[51] Int. Cl.[4] .............................................. B65G 65/00
[52] U.S. Cl. ...................................... 414/217; 414/222
[58] Field of Search .................... 414/182, 207, 222; 198/345, 346.2, 346.1

[56] References Cited

U.S. PATENT DOCUMENTS

| 3,641,973 | 2/1972 | Shrader | 414/182 X |
|---|---|---|---|
| 4,336,438 | 6/1982 | Uehara et al. | 414/222 X |
| 4,543,059 | 9/1985 | Whang et al. | 414/182 X |
| 4,589,540 | 5/1986 | Kampf | 198/345 |
| 4,604,020 | 8/1986 | Torolira et al. | 414/217 |
| 4,609,320 | 9/1986 | Rubin | 198/346.2 X |
| 4,636,128 | 1/1987 | Millis et al. | 414/217 |
| 4,643,629 | 2/1987 | Takahashi et al. | 414/222 X |
| 4,649,830 | 3/1987 | Tanaka | 414/217 X |

Primary Examiner—Peter A. Aschenbrenner
Attorney, Agent, or Firm—Charles Hieken

[57] ABSTRACT

A housing has a flange for engagement with an evacuable vessel having a work table for supporting devices to be processed with an ion beam inside the vessel. The housing has rails extending into the vessel toward the work table. A carriage rides on the rails and has upstanding pins that engage a cassette carrying the masks to be processed. A transport mechanism housing is in sealing relationship with the bottom of the housing and supports a motor-driven drum about which a steel tape is wrapped and surrounded by a circumferential set of rollers. The far end of the steel tape is connected to the carriage. A loading door selectively closes the opening of the housing away from the vessel. The top of the housing includes a glass port.

4 Claims, 16 Drawing Figures

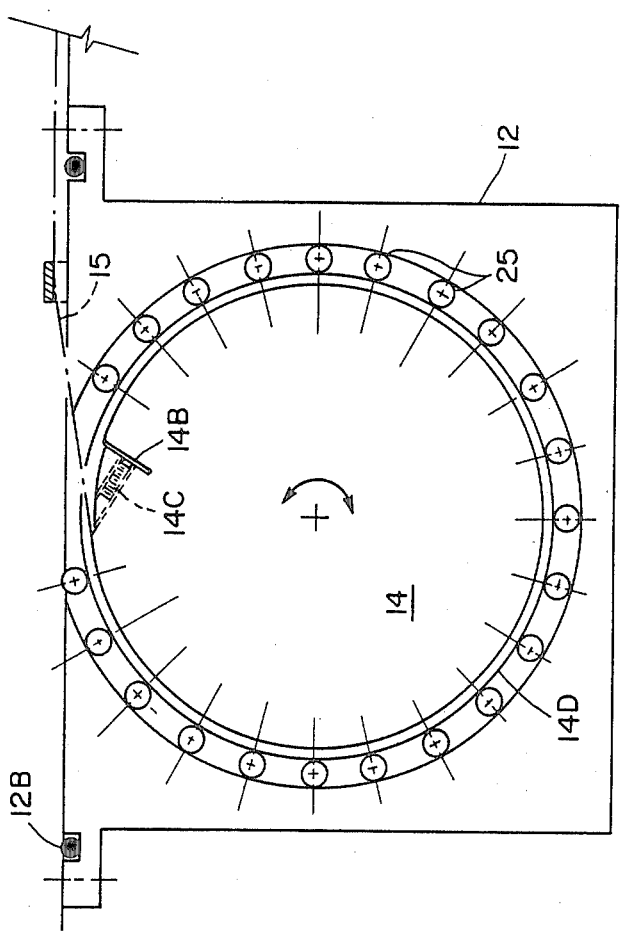
Fig. 3
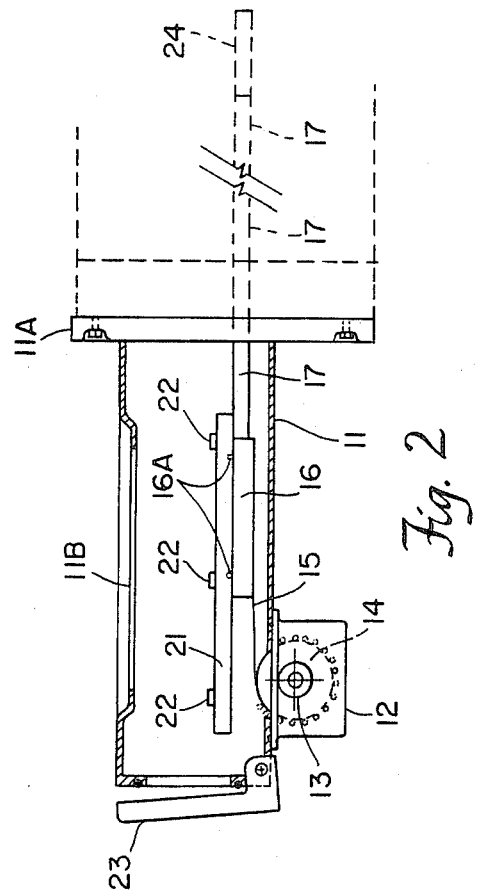
Fig. 3A
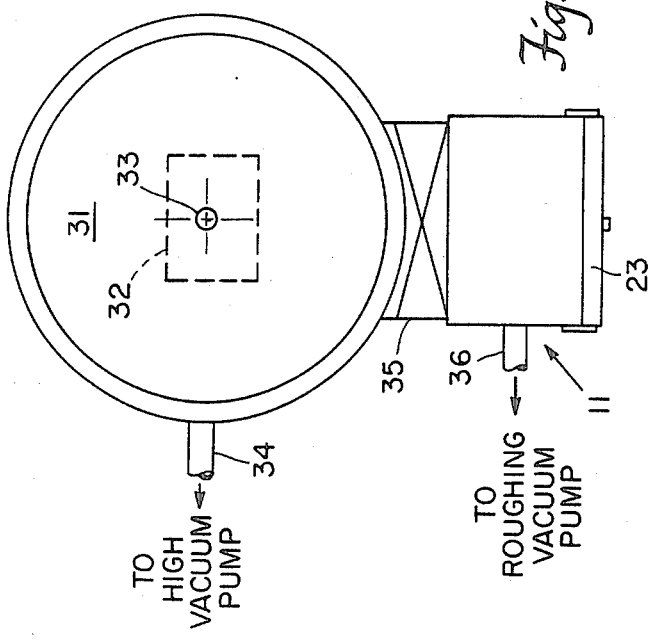
Fig. 1
Fig. 2

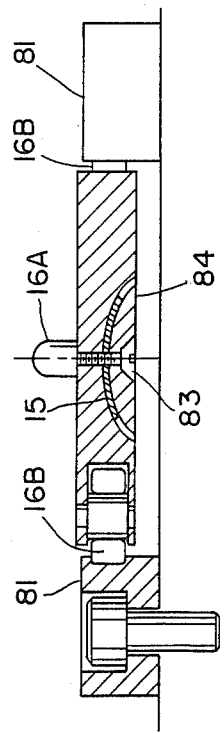
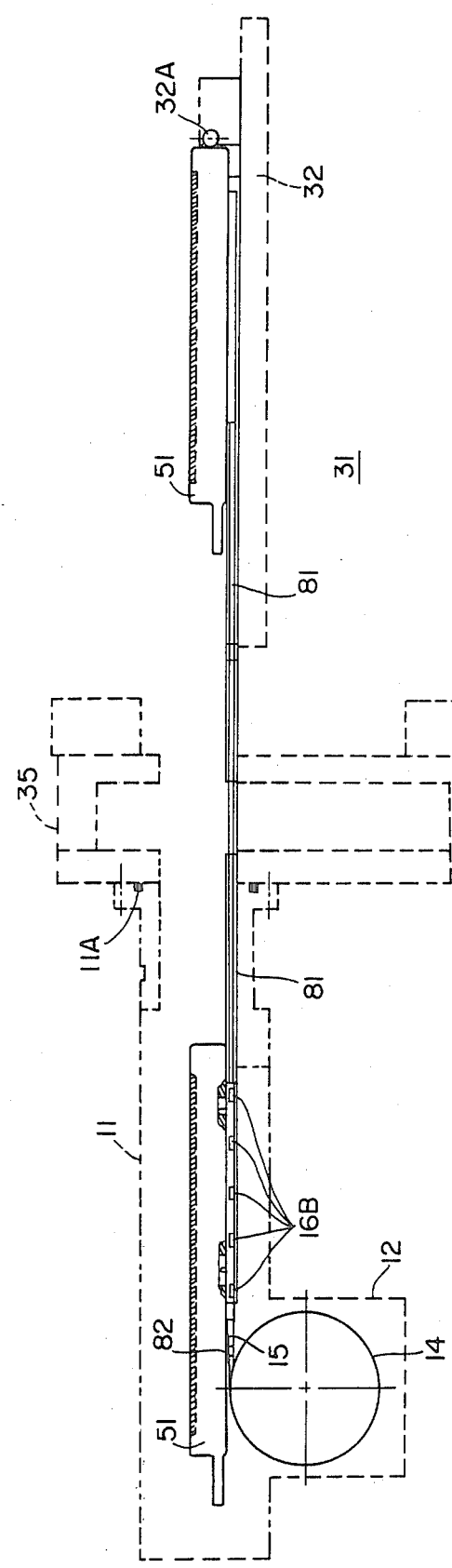

MODULE POSITIONING APPARATUS

The present invention relates in general to positioning modules and more particularly concerns novel apparatus and techniques for inserting a cassette having a mask to be processed into an evacuated ion chamber. The term cassette may be referred to as a module having an external geometry (or shape) which allows its acceptance by the work table in the vacuum work chamber, and a variety of internal geometries for accepting different size masks or wafers.

It is an important object of the invention to provide improved apparatus and techniques for inserting a module into an evacuated chamber.

According to the invention, there is load-lock housing means for attachment to a vacuum valve of an evacuated chamber in vacuum sealing relationship. The housing means including loading door means for selectively providing access to the inside of the housing means. Motor means is attached to the bottom of the housing means in a vacuum tight compartment for selectively moving semirigid tape means connected to carriage means for supporting cassette means for carrying a mask or other device to be processed in the evacuated chamber. Preferably, the carriage means includes upstanding pin means for engaging the bottom of the cassette means.

According to the process of the invention, the loading door means opens, and a cassette means enters the inside of the housing. Closing the loading door means establishes a vacuum tight seal at the opening covered by the loading door means and lowers the cassette means upon the carriage means upstanding pins. Energizing the motor means then advances the semirigid tape means and attached carriage means and cassette means through the vacuum valve into the evacuated housing upon the work table. Clamping means on the work table lifts the cassette off the carriage and retains the cassette in a precise registration location required for subsequent interaction between the substrate and a focused beam. This disengagement allows automatic retrieval of the carriage means back into the load-lock housing means. After processing, the motor means may be reversed to withdraw the carriage means and cassette means from the evacuated area back into the housing. The loading door means may then be opened, and the cassette bearing the processed item withdrawn.

Numerous other features, objects and advantages of the invention will become apparent from the following specification when read in connection with the accompanying drawings in which:

FIG. 1 is a diagrammatic plan view of a system having a vacuum work chamber enclosing a work table and ion beam;

FIG. 2 is a diagrammatic side view of an embodiment of the invention;

FIG. 3 is a diagrammatic side view of the transport drive;

FIG. 3A shows a transverse sectional view of the semirigid tape;

FIG. 14 is a diagrammatic elevation view partially in section helpful in understanding how the cassette moves between the load-lock housing and the vacuum work chamber; and FIG. 15 is an end view partially in section fragmentarily illustrating the relationship among elements including the carriage and carriage guides.

Figure 4:
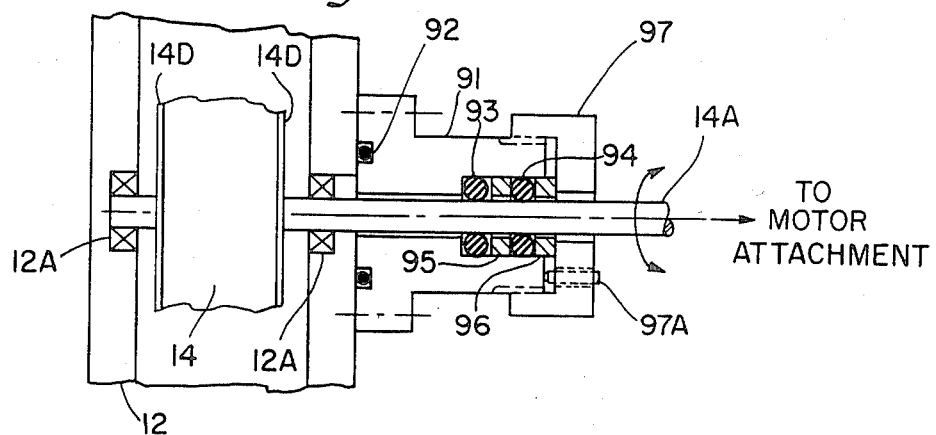
FIG. 4 is a fragmentary diagrammatic view partially in section illustrating the vacuum seal around the shaft interconnecting the tape drum and drive motor.

With reference now to the drawing and more particularly FIG. 1 thereof, there is shown a diagrammatic plan view of a system having a vacuum work chamber 31 enclosing a work table 32 and ion beam 33. An outlet 34 is connected to a high vacuum pump. The load-lock housing 11 is coupled to vacuum work chamber 31 by vacuum gate valve 35. Closing valve 35 allows the operator to vent the load-lock housing 11 through outlet 36, which may also be connected to a vacuum pump, without affecting the vacuum level inside work chamber 31. Then the operator may open loading door 23 and insert a cassette holding a substrate to be processed. After closing loading door 23, load-lock housing 11 is evacuated using a mechanical vacuum pump, generally referred to as a roughing pump, connected to port 36 to a pressure level sufficiently low so that it will not appreciably affect the vacuum level in work chamber 31 when vacuum valve 35 opens. The substrate may then be positioned in the work chamber through the open vacuum valve 35 and retrieved after processing.

The typical prior art approach involved cumbersome mechanisms for transporting and retrieving the substrate to be processed. For example, a long rod provided with a sliding vacuum seal has been used to insert or retract substrates. Such a device may also require an auxiliary motion, such as a rotary motion for engaging the cassette with a pin for retrieval. The protrusions of such a mechanism are undesirable and represent a physical hazard to personnel.

The present invention embodies a module having many features. It can be assembled in production separately and easily attached to the process module's vacuum work chamber. It allows for easy manual insertion of the cassette into and withdrawal from the load-lock housing. It facilitates automatic engagement of the cassette with the mechanism which transports and retrieves the cassette to and from the vacuum work chamber. It is a small compact mechanism, which does not extend the front profile of the machine appreciably for transporting the cassette relative to the vacuum work chamber. It allows the vacuum valve to be a separate and independent module readily accessible for servicing.

A cassette, or holder, containing a photomask or wafer-type substrate, must be placed inside a vacuum work chamber to allow a focused ion beam or electron beam to process the photomask or wafer substrate. Such particle beams require a vacuum environment in the order of $10^{-7}$ to $10^{-9}$ Torr for proper operation. Practical considerations require maintaining the vacuum environment continuously to avoid wasting time by repeatedly venting and evacuating the large vacuum work chamber. The smaller pre-chamber, or load-lock, is conventionally used for exchanging substrates between the atmosphere and vacuum environments.

Referring to FIG. 2, there is shown a diagrammatic side view of an embodiment of the invention. A housing 11 is formed with a mounting flange 11A for vacuum sealing engagement with a vacuum gate valve in the evacuated chamber. A motor housing 12 is secured to the bottom of housing 11 in vacuum sealing relationship and includes an electric motor 13 that rotates a drum 14 that unwinds and winds a semirigid steel tape 15, similar to a steel measuring tape used by carpenters, connected to carriage 16 riding on tracks 17.

Carriage 16 is formed with pins 16A for engaging the underside of cassette 21, typically 8.812" wide by 7.75" long for carrying masks, such as 22 to be processed. The top of housing 11 includes a quartz glass port 11B to provide visual access to the interior of the housing allowing ultraviolet light transmission for inspection of dust particles. A loading door 23 allows access to the interior of housing 11 for removing and inserting cassettes with masks or other substrates to be processed. Guide rails 17 communicate with work table 24 inside the evacuated chamber.

Referring to FIG. 3, there is shown a diagrammatic side view of the transport drive illustrating certain structural features. Tape 15 is wound on drum 14 and is fed out at the top of a circumferential channel bounded by rollers such as 25. As best seen in FIG. 3A, steel tape 15 is preferably bowed as shown with the concave surface down and the convex surface up to provide longitudinal strength for pushing carriage 16 carrying cassette 21.

Drum housing 12 is fastened to the bottom of loadlock housing 11 and vacuum sealed by means including O-ring 12B. Drum 14 is typically a three-inch diameter drum. Tape 15 is captured in an angled slot 14B and retained by set screw 14C. Drum 14 is formed with ridges 14D to allow proper alignment during payout and return of tape 15. Many rollers 25 (every 15°) are used to provide a uniform envelope diameter for tape 15. These rollers prevent tape 15 from expanding against the inside diameter of housing 12 during payout. The attendant sliding action of the tape against the walls would increase friction and generate undesired particulate matter which would be disadvantageous for use in ion beam processing applications.

Referring to FIG. 4, there is shown a fragmentary diagrammatic view partially in section illustrating the vacuum seal around the shaft interconnecting tape drum 14 and the drive motor 13 (not shown in FIG. 4). Drive shaft 14A is of small diameter and polished smooth, typically about 4 micro-inch roughness value and lubricated with a vacuum-type lubricant. A seal adapter 91 is clamped to housing 12 with the gap therebetween sealed by O-ring 92 for accommodating an inner O-ring 93 and outer O-ring 94 alternating with annular spacers 95 and 96 held in place by threaded retainer 97. Shaft 14A rotates within ball bearings 12A in housing 12.

O-rings 93 and 94 are made of high durometer material characterized by low contact coefficient of friction. Tightening threaded retainer 97 applies pressure through spacers 96 and 95 to compress the assembly of O-rings and spacers and squeeze the O-rings 93 and 95 against the smooth shaft 14A. A set screw 97A locks threaded retainer 97 in place.

Figure 5:
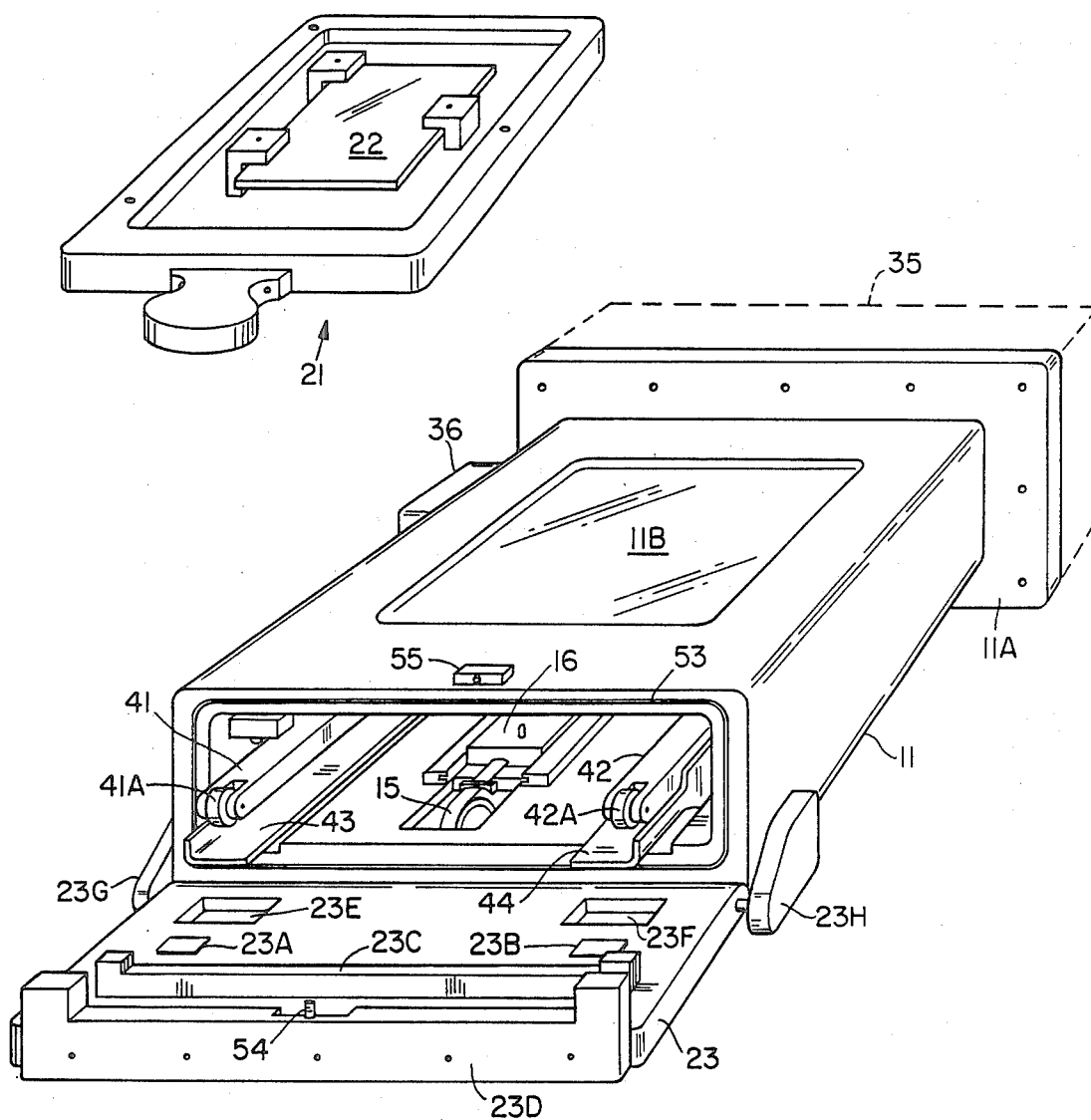
FIG. 5 is a perspective view of an embodiment of the invention.

Referring to FIG. 5, there is shown a perspective view of the invention illustrating a number of features with loading door 23 open. Left and right actuator bars 41 and 42 protrude from the inside of housing 11, typically about one inch. Opening and closing loading door 23 causes actuator bars 41 and 42 to move outward and inward, respectively. For example, as door 23 is manually closed, bearing contact pads 23A and 23B contact bearings 41A and 42A on actuator bars 41 and 42, respectively, at about 70° rotation of door 23 from the horizontal. The manual grip point of door 23 is further from the hinge point at the bottom than actuator bars 41 and 42, thereby providing mechanical advantage to aid in overcoming the force required to move the actuator bars. This force is typically of the order of three pounds total, easily applied by an operator closing door 23.

In order to facilitate insertion and removal of the cassette, inner and outer rest bars 23C and 23D, respectively, are mounted on door 23 for receiving a cassette. The rest bar internal horizontal surfaces are in the same plane as the elevator rails 43 and 44, thereby allowing the cassete to be easily slid upon rails 43 and 44. Rest bars 23C and 23D also provide lateral guidance for the cassette. To further aid insertion of the cassette, elevator rails 43 and 44 extend slightly outside housing 11. Cavities 23E and 23F in door 23 accommodate these protruding ends when door 23 is closed.

FIG. 5 also shows carriage 16 and tape 15. Cassette 21 is shown with mask 22 clamped into position. Cassette 21, when placed on carriage 16, is transported (or retrieved) into (or from) vacuum work chamber 31 (FIG. 2) by the tape drive.

An O-ring 53 seals the opening covered by door 23 with left and right hinge housings 23G and 23H having spring loaded hinge pins that allow the bottom of door 23 to move away from housing 11 slightly when fastener element 54 is seated in the opening of fastener element 55 and tightened. The spring loaded hinges also serve a safety function in allowing gas to escape from the inside of housing 11 should the venting pressure inside become too high.

Figure 6:
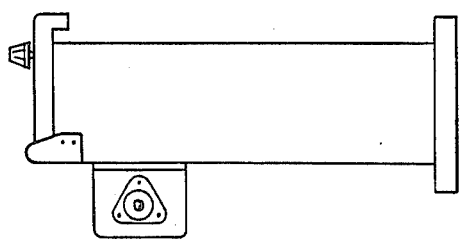
FIG. 6 is a side elevation view of the housing with door closed.
Figure 7:
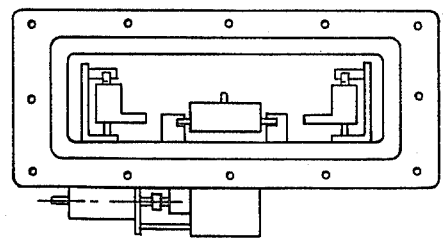
FIG. 7 is a rear elevation view of the housing.

Referring to FIG. 6, there is shown a side elevation view of housing 11 with door closed. Referring to FIG. 7, there is shown a rear elevation view of housing 11.

Figure 8:
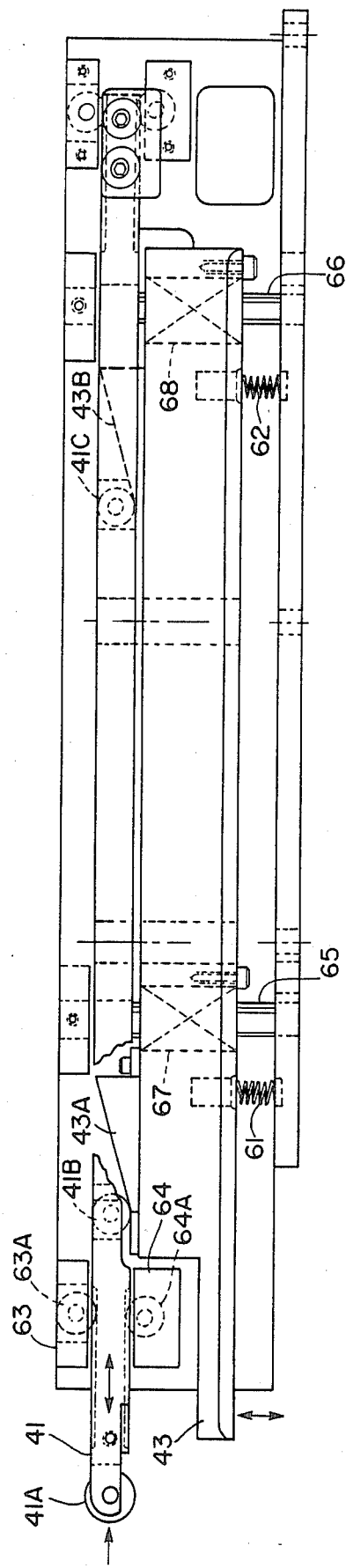
FIG. 8 is a side elevation view of a left elevator assembly.

Referring to FIG. 8, there is shown a side elevation view of the left elevator assembly helpful in understanding its mode of operation. The horizontal motion of actuator bar 41 causes a vertical motion of left elevator rail 43 by constraining actuator bar 41 to move horizontally. Bar 41 produces a vertical force as ball bearings 41B and 41C ride up tapered blocks 43A and 43B to which left rail 43 is attached, forcing left rail 43 down against compression springs 61 and 62 as guide blocks 63 and 64 with roller bearings 63A and 64A constrain actuator bar 41 to horizontal movement. Fixed guide shafts 65 and 66 upon which linear ball bushings 67 and 68, respectively, ride, constrain elevator rail 43 to move vertically.

Significant mechanical advantage, about four, is obtained by using tapered blocks 43A and 43B in producing the vertical force required to compress compression springs 61 and 62. One-inch horizontal movement of actuator bar 41A lowers elevator rail 43 about ¼ inch and places cassette 21 on carriage assembly 16.

Figure 9:
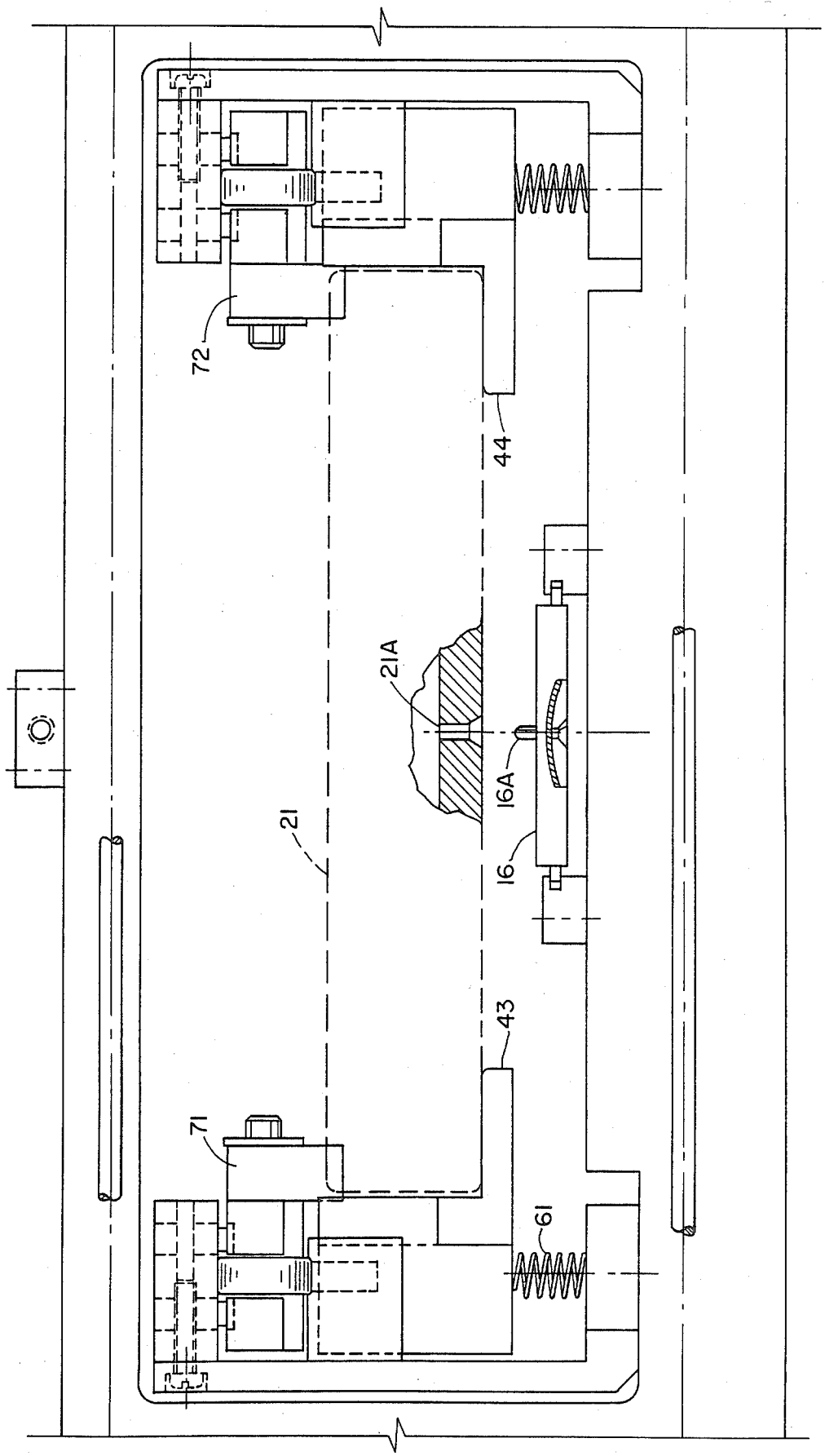
FIG. 9 is a front elevation view of the housing with the outline of a cassette shown in position against mechanical stops.

Referring to FIG. 9, there is shown a front view in elevation looking into housing 11 with the outline of cassette 21 shown in position against mechanical stops 71 and 72. A partial cross section shows one of the pinholes 71A which accepts a pin, such as 16A, on carriage assembly 16. FIG. 9 shows the elevator rails 43 and 44 in the raised position.

Figure 10:
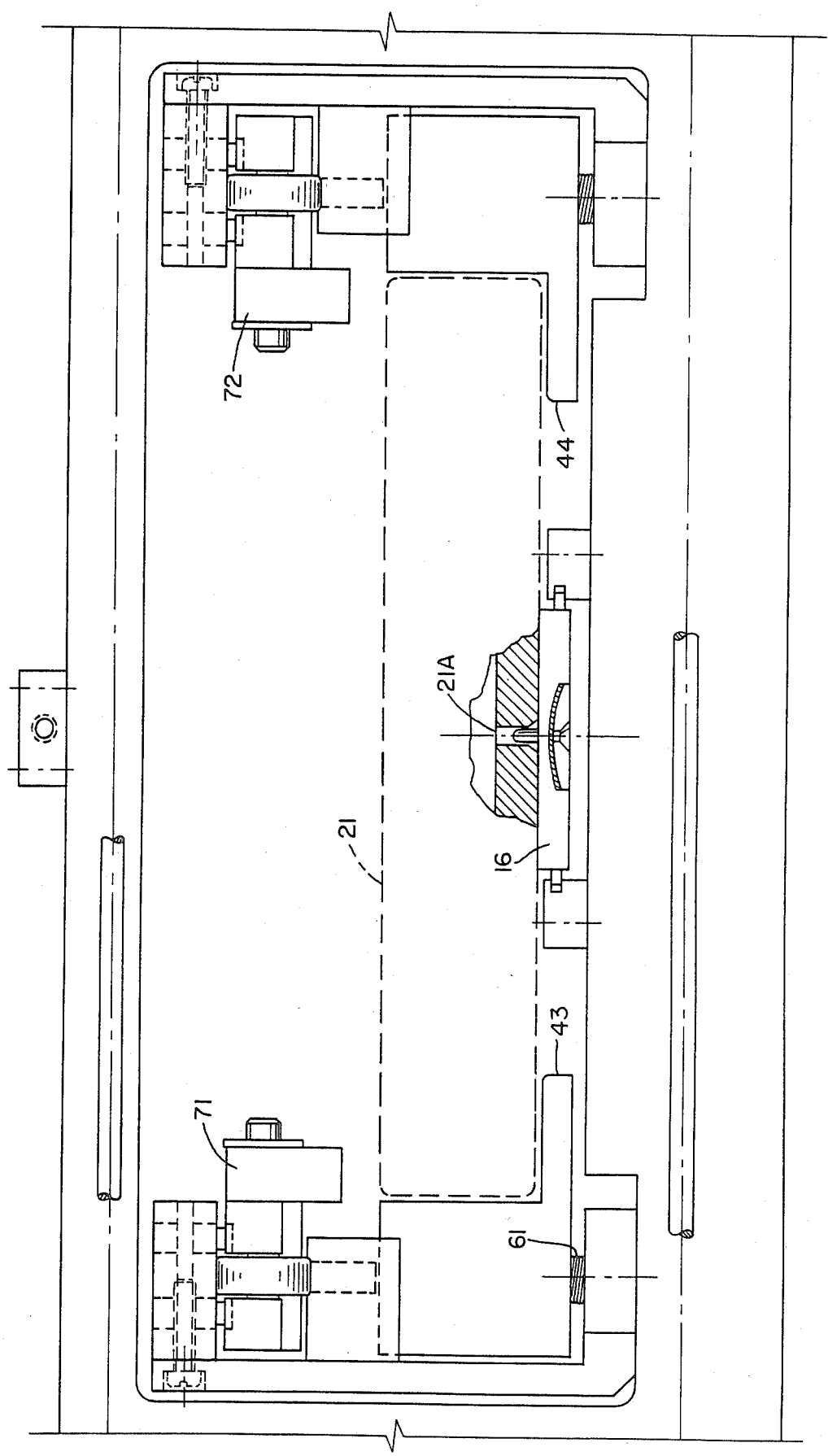
FIG. 10 is a view similar to FIG. 9, but with elevator rails in the lower position.

Referring to FIG. 10, there is shown a front elevation view similar to that in FIG. 9, but with elevator rails 43 and 44 in the lower position (door 23 closed) and cassette 21 engaged with carriage assembly 16. Electrical interlock switches of a type well-known in the art (not shown) may provide a signal representative of door closure and carriage position. The signal from this interlock switch may be used for automatically sequencing the transport with respect to the system cycle; e.g., evacuate load-lock housing 11, open vacuum gate valve 35, transport cassette 21 into vacuum work chamber 31, retrieve carriage assembly 16, close valve 35 and allow work to be performed on the substrate.

It is preferred that ball bearings and ball bushings be used throughout for the mechanism involved in raising and lowering elevator rails 43 and 44 as shown in FIG. 8. Such bearings are compatible with the intermittent vacuum environment in lock housing 11 because they produce negligible outgasing. Also they provide very low friction, negligible particle generation and repeatable and reliable operation of the mechanism.

In order to assure positive and reliable sealing of door 23 against the captive O-ring 53 in housing 11, the hinges of door 23 include a spring mounting. This spring mounting allows presure to be applied along the lower portion of O-ring 53 when the operator engages the latch at door closure with latch elements 54 and 55 engaged. Elements 54 and 55 comprise a quick-turn (½-turn) fastener for latching door 23.

Figure 11:
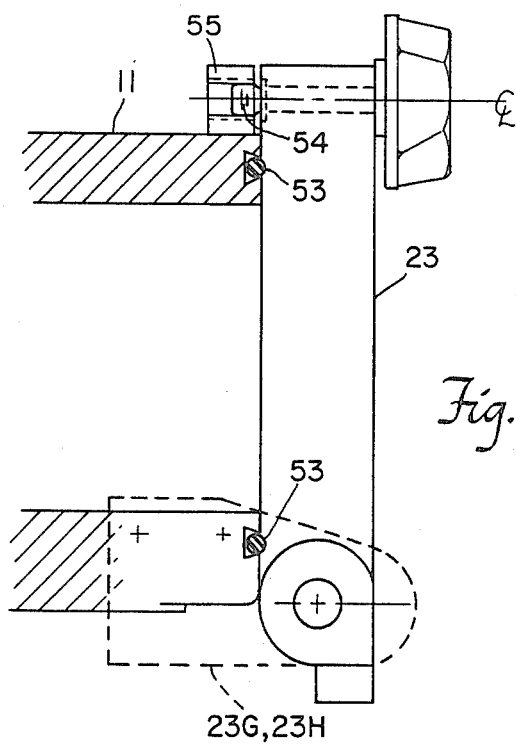
FIG. 11 is a fragmentary elevation view showing structural details of the door assembly.
Figure 12:
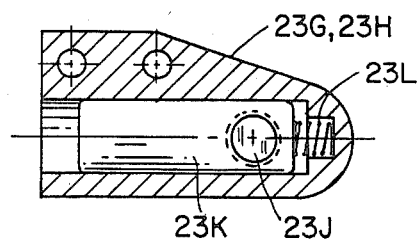
FIG. 12 is a sectional view of a hinge mount housing.
Figure 13:
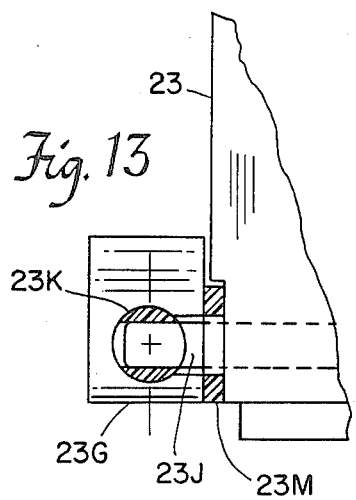
FIG. 13 is a fragmentary front view partially in section illustrating hinge features.

Referring to FIG. 11, there is shown a fragmentary elevation view helpful in understanding structural details of the door assembly. FIG. 12 is a sectional view of a hinge mount housing, and FIG. 13 shows a fragmentary front view partially in section illustrating certain features. The hinge pins, such as 23J, are seated in a hole in a plastic rod, such as 23K, slidable in a cavity in the hinge mount housing against a compression spring, such as 23L. As best seen in FIG. 13, a plastic washer 23M separates door 23 from a hinge housing, such as 23G, to prevent metal-to-metal contact.

Since door 23 first contacts the lower portion of O-ring 53 upon closing, this lower portion of O-ring 53 functions as a pivot axis, and the hinge pin 23J must be allowed to move outward slightly. Comprssion spring 23L, which applies pressure on hinge pin 23J to obtain an initial sealing force against O-ring 53, then compresses to allow pivoting about the lower portion of O-ring 53 during initial contact. The gap shown between plastic rod 23K and the counterbore accommodating compression spring 23L in the hinge mounts, allows hinge pin 23J to move against the spring pressure of spring 23L.

The clearance provided in the hinge mounting holes allows the installer to align the hinge axis of door 23 to be parallel to the sealing surface of housing 11 and provide the proper initial spring load on hinge pin 23J. This alignment is important for assuring reliable sealing of the door so that the vacuum sequence may proceed. When the load-lock housing 11 is evacuated, atmospheric pressure on door 23 compresses O-ring 53 uniformly, and door 23 physically contacts metal housing 11 in metal-to-metal contact, a desirable feature for vacuum applications. Venting of load-lock housing 11 typically involves introducing dry nitrogen at a pressure above atmospheric by of the order of several pounds per square inch. If over-pressure occurs, door 23 moves outward against comprssion spring 23L to relieve the over-pressure condition. Thus, this structure provides an additional desirable safety feature.

Referring to FIG. 14, there is shown a diagrammatic elevation view partially in section helpful in understanding how cassette 21 moves between load-lock housing 11 and vacuum work chamber 31 through vacuum gate valve 35. Although in practice cassette 21 is either in load-lock housing 11 or vacuum work chamber 31, it is convenient to here illustrate cassette 21 in both locations. Semiflexible tape 15 pushes (or pulls during retrieval) carriage 16 along carriage guides, such as 81 engaged by carriage ball bearings, such as 16B. Guides such as 81 on each side constrain carriage 16 to move along a straight line. Carriage 16 has a sufficient length, of the order of 4.5 inches, and bearings such as 16B, to move in a reasonably precise manner and allow bridging the valve area 35 where guides are absent. Ball bearings 16B create minimal resistance to motion. The pushing force provided by tape 15 is sufficiently small so that tape 15 does not buckle during transport. However, when cassette 21 is deposited on x-y work table 32 in vacuum work chamber 31, the force required to positively push cassette 21 against mechanical stop 32A may cause tape buckling. An antibuckling member 82 mounted near the point where tape 15 unwinds from drum 14 where the tape curvature is not fully developed prevents buckling and allows sufficient force to be applied to assure positive registration of cassette 21 against mechanical stop 32A in work chamber 31.

Referring to FIG. 15, there is shown an end view partially in section fragmentarily illustrating the relationship among various elements including carriage 16 and carriage guides 81. This view illustrates how tape 15 may be secured in carriage 16 bowed as shown and clamped by means including an 0–80 screw 83 and a convex clamping member 84.

The invention has a number of advantages. It provides convenient means and techniques for transporting devices between the outside and a chamber subject to a differential pressure. The apparatus operates reliably and is relatively inexpensive and free from complexity.

There has been described novel apparatus and techniques for exchanging items with a vessel under pressure. It is evident that those skilled in the art may now make numerous uses and modifications of and departures from the specific apparatus and techniques herein disclosed without departing from the inventive concepts. Consequently, the invention is to be construed as embracing each and every novel feature and novel combination of features present in or possessed by the apparatus and techniques herein disclosed and limited solely by the spirit and scope of the appended claims.

What is claimed is:

1. Apparatus for providing access to a vessel subject to being under pressure comprising, housing means for establishing a sealing connection to an opening in said vessel, carriage means for supporting devices to be processed in said vessel, rail means in said housing means extending into said vessel for slidably supporting said carriage means, transport mechanism housing means for sealing connection with the bottom of said housing means for accommodating transport mechanism means for moving said carriage means along said rail means, said transport mechanism means comprising, a semirigid tape connected to said carriage means, drum means for rotatably supporting said semirigid tape and storing portions of said semirigid tape around the drum means, and motor means for selectively rotating said drum means to extend and withdraw said tape means and thereby move said carriage means into and from said vessel.

2. Apparatus in accordance with claim 1 and further comprising, loading door means for selectively allowing access into the end of said housing means away from said vessel, said loading door means being in sealing relationship with said housing means when in the closed position.

3. Apparatus in accordance with claim 1 and further comprising, cassette means for carrying devices to be processed, said cassette means being supported by said carriage means.

4. Apparatus in accordance with claim 3 wherein said carriage means is formed with upstanding pins for mating engagement with corresponding openings in said cassette means.

* * * * *